(12) United States Patent
Lai

(10) Patent No.: US 8,888,352 B2
(45) Date of Patent: Nov. 18, 2014

(54) BACKLIGHT STRUCTURE AND METHOD FOR MANUFACTURING THE SAME

(75) Inventor: Chih-Chen Lai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 216 days.

(21) Appl. No.: 13/572,685

(22) Filed: Aug. 12, 2012

(65) Prior Publication Data

US 2013/0194824 A1 Aug. 1, 2013

(30) Foreign Application Priority Data

Jan. 30, 2012 (TW) .................................. 101102823

(51) Int. Cl.
*G09F 13/04* (2006.01)

(52) U.S. Cl.
USPC ............................ 362/612; 362/615; 362/616

(58) Field of Classification Search
USPC .......................................... 362/612, 615, 616
See application file for complete search history.

(56) References Cited

U.S. PATENT DOCUMENTS

2006/0268567 A1* 11/2006 Jang et al. ..................... 362/555

* cited by examiner

*Primary Examiner* — David V Bruce
(74) *Attorney, Agent, or Firm* — Novak Druce Connolly Bove + Quigg LLP

(57) ABSTRACT

A backlight structure includes a light source module and a light guiding plate. The light source module includes a circuit board, a lighting unit arranged on the circuit board, and a hollow baffle plate surrounding the lighting unit. The circuit board defines a groove in a surface thereof, and a bottom end of the baffle plate is embedded in the groove. The lighting unit is located between the light guiding plate and the circuit board, and the light guiding plate is disposed on the baffle plate. A method for manufacturing the backlight structure is also provided.

13 Claims, 6 Drawing Sheets

BACKLIGHT STRUCTURE AND METHOD FOR MANUFACTURING THE SAME

BACKGROUND

1. Technical Field

The present disclosure generally relates to backlight structures, and particularly to a light emitting diode (LED) backlight structure with small height and a method for manufacturing the LED backlight structure.

2. Description of the Related Art

An LED backlight structure normally includes a light guiding plate, a printed circuit board (PCB) and a plurality of LEDs mounted on the PCB. The light guiding plate is positioned on a top of the LEDs, thereby guiding light emitted from the LEDs.

Generally, the plurality of LEDs are firstly packaged with lead frames, and then mounted on the PCB by surface mount technology (SMT). That is, lead frames of the LEDs are attached to solder pads of the PCB by solder. Therefore, the light guiding plate is spaced from the PCB by a distance consisting of thicknesses of the lead frames, the solder pads and the LEDs, which increases a whole height of the backlight structure. In addition, during operation of the LEDs, heat generated by the LEDs is transferred to the lead frames, and thus the solder will probably be softened to affect the electrical connection of the LEDs and the PCB and thus the reliability of the backlight structure.

What is needed therefore is a backlight structure and a method for manufacturing the backlight structure, which can overcome the above mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present backlight structure 100 and a method for manufacturing the backlight structure 100, in detail.

Figure 1:
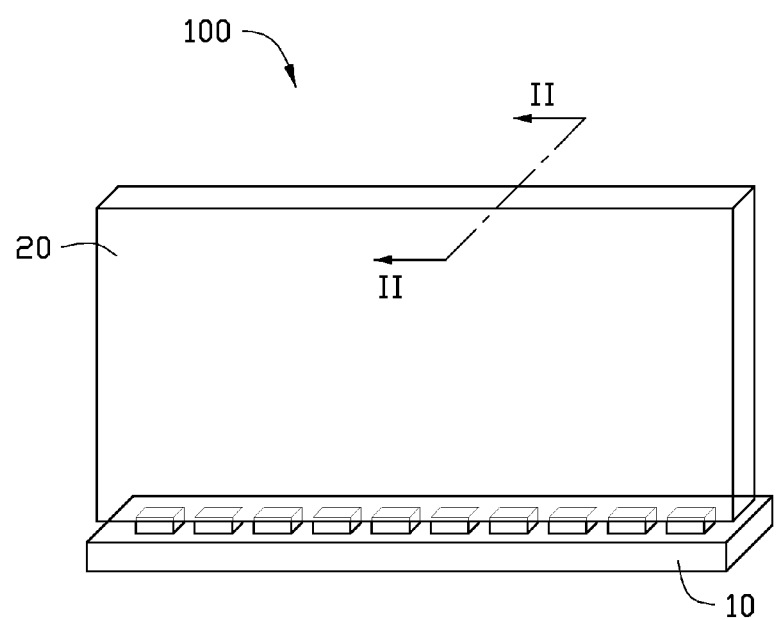
FIG. 1 is an assembled, isometric view of a backlight structure in accordance with an embodiment of the disclosure.

Referring to FIG. 1, a backlight structure 100 in accordance with an embodiment of the disclosure is shown. The backlight structure 100 includes a light source module 10 and a light guiding plate 20 positioned on the light source module 10.

Figure 2:
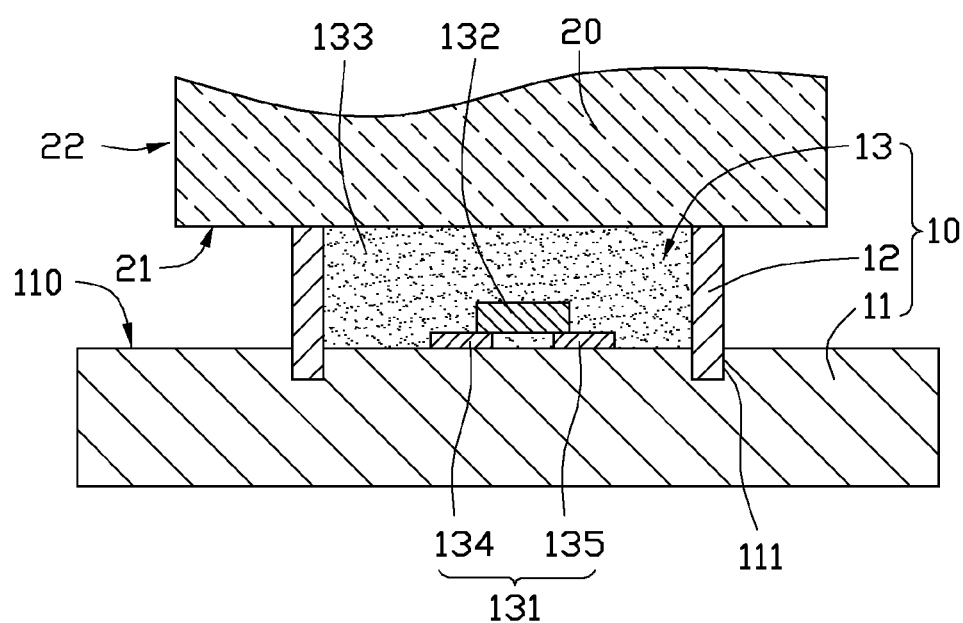
FIG. 2 is a part, in an enlarged scale, of a cross-sectional view of the backlight structure of FIG. 1, taken along line II-II thereof.

Referring to FIG. 2, the light guiding plate 20 includes a light incident surface 21 and a light output surface 22 perpendicular to the light incident surface 21. In this embodiment, the light guiding plate 20 is rectangular. That is, the backlight structure 100 is an edge-lighting backlight structure.

The light source module 10 is located adjacent to the light incident surface 21 of the light guiding plate 20. The light source module 10 includes a PCB 11, a plurality of baffle plates 12 fixed on the PCB 11, and a plurality of lighting units 13 mounted on the PCB 11.

The plurality of lighting units 13 are located on a top surface 110 of the PCB 11, and electrically connect to the PCB 11. A plurality of grooves 111 are defined in the top surface 110 of the PCB 11, and the grooves 111 each have a shape of a rectangular loop. The PCB 11 is a heat conducting plate which can dissipate heat generated by the lighting units 13.

Each of the baffle plate 12 has a hollow rectangular shape like a rectangular tube. A bottom end of each baffle plate 12 is embedded in a corresponding groove 111 and surrounds a corresponding lighting unit 13. In this embodiment, the baffle plate 12 is made of plastic. Alternatively, the baffle plate 12 can also be made of other suitable materials such as polyester, silica gel, polymer and epoxy resin.

Each lighting unit 13 includes an electrode structure 131, an LED component 132 positioned on and electrically connected to the electrode structure 131, and an encapsulation 133 covering the LED component 132 and the electrode structure 131.

The electrode structure 131 is located on the top surface 110 of the PCB 11 and received in the corresponding baffle plate 12. The electrode structure 131 includes a first electrode 134 and a second electrode 135 spaced from the first electrode 134. The electrode structure 131 can be made of metal or indium tin oxide (ITO) with high electrical conductivity. In this embodiment, the electrode structure 131 is made of copper.

The LED component 132 is positioned on top surfaces of neighboring ends of the first electrode 134 and the second electrode 135 by flip chip, and electrically connected to the first electrode 134 and the second electrode 135 respectively.

The encapsulation 133 is formed on the PCB 11 and covers the LED component 132. The encapsulation 133 is received in a space defined and surrounded by the corresponding baffle plate 12. A top surface of the encapsulation 133 is coplanar with a top surface of the baffle plate 12, and the light incident surface 21 contacts the top surfaces of the baffle plate 12 and the encapsulation 133. The encapsulation 133 is made of transparent material. The encapsulation 133 can also include fluorescent materials distributed therein.

Alternatively, the baffle plate 12 can also have a hollow, cylindrical shape or a hollow, triangular shape, and the shape of the groove 111 is altered correspondingly. A reflective layer can also be formed on an inner surface of the baffle plate 12.

In addition, only one groove and one baffle plate with relatively large size can be provided to substitute for the plurality of grooves 111 and baffle plates 12. In this situation, all of the lighting units 13 are surrounded the groove and the baffle plate.

FIGS. 3 to 6 show a method for manufacturing the light source structure 100 in accordance with one embodiment of the present disclosure. The method for manufacturing the light source structure 100 includes the following steps.

Figure 3:
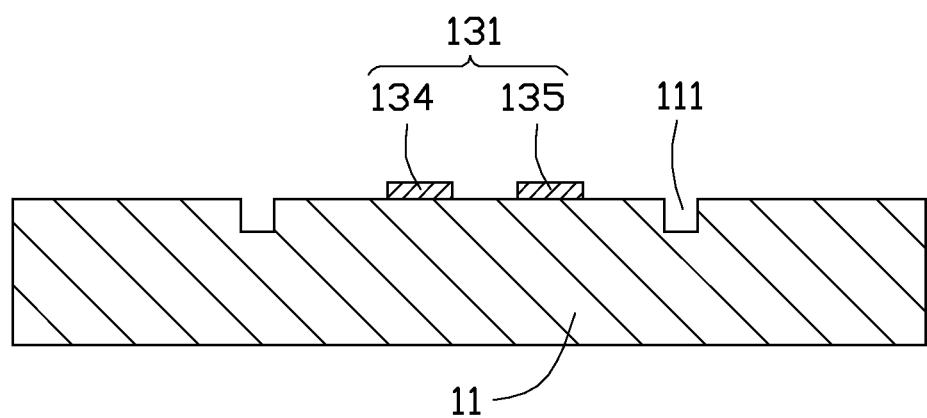
FIGS. 3 to 6 are cross-sectional views in an enlarged scale showing different steps of a method for manufacturing the backlight structure of FIG. 1.

Referring to FIG. 3, a PCB 11 is provided, and the top surface of the PCB 11 is etched to define a plurality of grooves 111 each having a shape of a rectangular loop.

A plurality of electrode structure 131 are formed on the top surface 110 of the PCB 11. Each of the electrode structure 131 is surrounded by a corresponding groove 111. The electrode 131 includes a first electrode 134 and a second electrode 135 spaced from each other.

Figure 4:
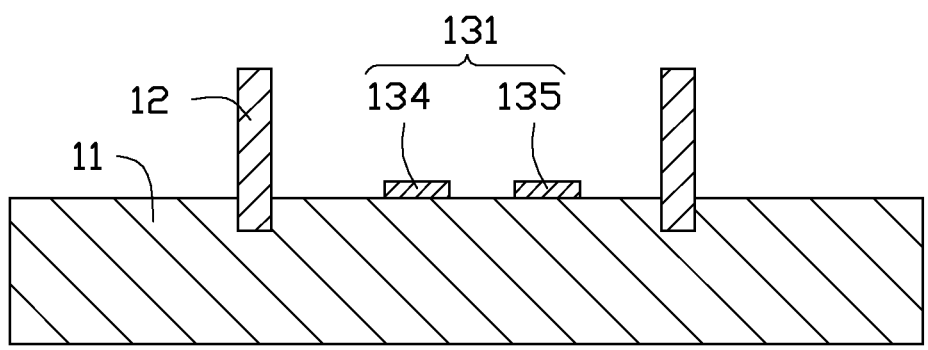

Referring to FIG. 4, a plurality of hollow baffle plates 12 is provided, and a bottom end of each of the baffle plates 12 is embedded in the corresponding groove 111. The electrode structure 131 is surrounded by the corresponding baffle plate 12. In this embodiment, the baffle plate 12 can be made of suitable materials such as polyester, silica gel, polymer and epoxy resin.

Figure 5:
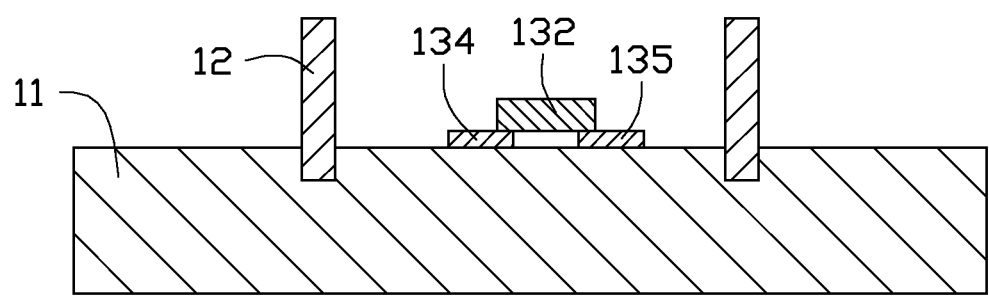

Referring to FIG. 5, an LED component 132 is arranged on each electrode structure 131, and the LED component 132 is electrically connected to the first electrode 134 and the second electrode 135 by flip-chip. The LED component 132 is positioned on top surfaces of neighboring ends of the first electrode 134 and the second electrode 135.

Figure 6:
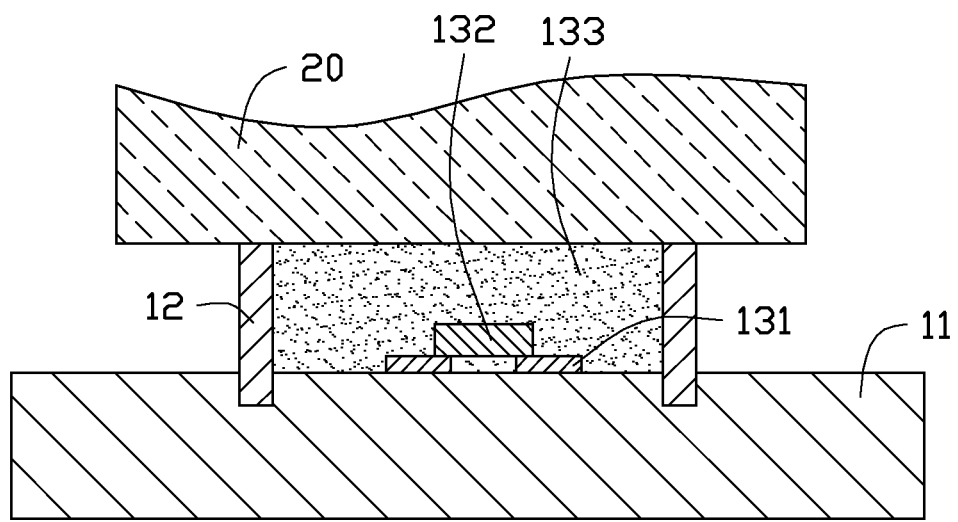

Referring to FIG. 6, an encapsulation 133 is provided to cover the LED component 132 and fill the space defined by the baffle plate 12. The top surface of the encapsulation 133 is coplanar with the top surface of the baffle plate 12.

A light guiding plate 20 is set over a top of the LED component 132. Both the top surface of the encapsulation 133 and the top surface of the baffle plate 12 are in contact with the light incident surface 21 of the light guiding plate 20.

Since the bottom end of the baffle plate 12 is fixed in the groove 111, and the LED component 132 is directly packaged on the PCB 11, without employing any lead frames, to provide illumination for the light guiding plate 20. Accordingly, the space provided for the conventional lead frames between the light guiding plate 20 and the PCB 11 is omitted. Therefore, the light source structure 100 has a decreased height. In addition, the heat generated by the LED component 13 can be directly transferred to the PCB 11 with high efficiency, which increases the reliability of the backlight structure 100.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A backlight structure comprising:
 a light source module comprising a circuit board, a lighting unit arranged on the circuit board, and a hollow baffle plate surrounding the lighting unit, the circuit board defining a groove in a surface thereof, a bottom end of the baffle plate being embedded in the groove; and
 a light guiding plate disposed on the baffle plate, the lighting unit being located between the light guiding plate and the circuit board.

2. The backlight structure according to claim 1, wherein the groove is loop-shaped, and the baffle plate has a shape matching with the shape of the groove.

3. The backlight structure according to claim 1, wherein a top end of the baffle plate contacts the light guiding plate.

4. The backlight structure according to claim 3, wherein the lighting unit comprises an electrode structure fixed on the circuit board, an LED component bonded on the electrode structure, and an encapsulation covering the LED component, a top surface of the encapsulation being coplanar with the top end of the baffle plate.

5. The backlight structure according to claim 4, wherein the electrode structure comprises a first electrode and a second electrode spaced from each other, and the LED component is electrically connected to the first electrode and the second electrode by flip-chip.

6. The backlight structure according to claim 4, wherein the light guiding plate comprises a light incident surface and a light output surface perpendicular to the light incident surface, and the light incident surface contacts the top end of the baffle plate.

7. The backlight structure according to claim 6, wherein both the top surface of the encapsulation and the top end of the baffle plate are in contact with the light incident surface of the light guiding plate.

8. A method for manufacturing a backlight structure comprising:
 providing a circuit board, and defining a groove in a top surface of the circuit board;
 providing a hollow baffle plate and a lighting unit on the circuit board, a bottom end of the baffle plate being embedded in the groove of the circuit board, the baffle plate surrounding the lighting unit; and
 disposing a light guiding plate on the baffle plate.

9. The method for manufacturing a backlight structure according to claim 8, wherein the step of providing the lighting unit on the circuit board comprises forming an electrode structure on the top surface of the circuit board, each electrode structure comprising a first electrode and a second electrode spaced from each other.

10. The method for manufacturing a backlight structure according to claim 9, wherein the step of providing the lighting unit on the circuit board further comprises arranging a light emitting diode (LED) component on the electrode structure, and electrically connecting the LED component to the first electrode and the second electrode.

11. The method for manufacturing a backlight structure according to claim 10, wherein the step of providing the lighting unit on the circuit board further comprises covering the LED component with an encapsulation, in which the encapsulation is surrounded by the baffle plate, and a top end of the baffle plate is level with a top surface of the encapsulation.

12. The method for manufacturing a backlight structure according to claim 8, wherein the groove is loop-shaped.

13. The method for manufacturing a backlight structure according to claim 8, wherein the baffle plate is a tubular plate with a bottom end embedded in the groove.

* * * * *